United States Patent
Wanlass

Patent Number: 5,970,367
Date of Patent: Oct. 19, 1999

[54] DOUBLE DAMASCENE PATTERING OF SILCON-ON-INSULATOR TRANSISTORS

[76] Inventor: Frank M. Wanlass, 540 Dawn Dr., Sunnyvale, Calif. 94087

[21] Appl. No.: 08/942,323

[22] Filed: Oct. 1, 1997

[51] Int. Cl.$^6$ .............................. H01L 21/00; H01L 21/20
[52] U.S. Cl. ......................... 438/479; 438/149; 438/166
[58] Field of Search ................................... 438/149, 151, 438/166, 478, 479, 481

[56] References Cited

U.S. PATENT DOCUMENTS

| | | |
|---|---|---|
| 4,952,526 | 8/1990 | Pribat et al. |
| 5,417,180 | 5/1995 | Nakamura |
| 5,565,029 | 10/1996 | Takasu |
| 5,668,046 | 9/1997 | Koh et al. |
| 5,874,328 | 2/1999 | Liu et al. |
| 5,882,958 | 3/1999 | Wanlass |

OTHER PUBLICATIONS

L. Jastrzebski, SOI by CVD: Epitaxial Lateral Overgrowth (ELO) Process—Review, Journal of Crystal Growth, 63, p. 493, 1983.

McD. Robinson, D. J. Lischner and G. K. Celler, "Large Area Recrystallization of Polysilicon with Tungsten–Halogen Lamps" Journal of Crystal Growth, 63, p. 484, 1983.

John C. C. Fan, B.–Y. Tsaur and M. W. Geis, "Graphite–Strip–Heater Zone–Melting recrystallization of Si Films", Journal of Crystal Growth, 63 p. 453, 1983.

*Primary Examiner*—Charles Bowers
*Assistant Examiner*—Martin Sulsky

[57] ABSTRACT

The present invention is a technique for producing silicon-on-insulator MOS transistors by damascene patterning of source-drain regions in a thin film of amorphous silicon deposited on a layer of oxide grown on a silicon wafer, where the oxide has previously been etched with a pattern of trenches. In addition, the technique provides for the amorphous layer to contact the underlying silicon substrate through multiple small oxide openings; where these openings have been previously filled with amorphous silicon, planarized and annealed at high temperature to form single crystal silicon; and where subsequent transistor channel regions will align to these filled openings. After patterning, the wafer is annealed in a second high temperature cycle, where the regions of amorphous silicon in contact with the single crystal silicon in the openings will convert into single crystal silicon suitable for transistor channel regions.

6 Claims, 5 Drawing Sheets

DOUBLE DAMASCENE PATTERING OF SILCON-ON-INSULATOR TRANSISTORS

BACKGROUND OF THE PRESENT INVENTION

1. Field of the Present Invention

The present invention relates to a technique for producing planar silicon-on-insulator MOS transistors by damascene patterning of a thin film of amorphous silicon deposited on a layer of oxide on a silicon wafer, followed by high temperature annealing to form single crystal MOS channel regions.

2. Description of the Prior Art

The primary advantage of using silicon-on-insulator (SOI) substrates, rather than using bulk silicon, for forming MOS transistors has long been recognized as being that of reduced stray capacitance. This allows, of course, higher operating frequencies to be obtained. SOI has other advantages such as better packing density, borderless contacts, latch-up freedom, and radiation hardness.

A thin film of crystalline silicon epitaxially deposited on a polished single crystal aluminum oxide substrate (SOS) was the first composite material to be used for SOI. However, since the crystal properties of aluminum oxide do not perfectly match those of silicon there has always been the problem of reduced yield due to defects in the silicon film.

In recent years SOI circuits have been made by forming a thin film of crystalline silicon on silicon dioxide, where the oxide has been grown on a silicon support wafer. This has enabled the production of silicon films with much lower defect densities because the support wafer physical properties, such as thermal expansion coefficient, match those of the silicon film. Currently SOI refers to silicon-on-oxide, which will be our convention.

There are a few different methods for producing SOI substrates, such as wafer bonding or high current oxygen implantation. All of these methods are rather difficult because the silicon film has to be single crystal, and for best performance of the finished circuit, the film should be very thin (less than approximately 1000 Angstroms).

Another difficulty with current SOI is that the MOS transistor body connections are typically left floating for efficiency of chip layout. This can sometimes cause problems. For example, excess charge can remain in a transistor floating body region when attempting to turn a transistor off, which can slow down circuit operation. This problem can be solved by implanting just the right amount of recombination centers in the film; however, this is difficult to control, because too many centers will degrade the mobility of the film.

It is therefore the object of the present invention to provide a simplified method for producing SOI substrates; and to provide a technique for electrically connecting MOS body regions to well defined voltages without incurring any layout area penalty; and to maintain the high density layout capability of current SOI.

SUMMARY OF THE PRESENT INVENTION

The present invention is a technique for damascene patterning of silicon-on-insulator MOS transistors in a thin film of amorphous silicon deposited on a layer of oxide grown on a silicon wafer, where the oxide has previously been partially etched with a pattern of trenches, and where the amorphous silicon is chem-mechanically removed everywhere but in these trenches. In addition, the invention provides for the amorphous layer to contact the underlying silicon substrate through multiple small oxide openings, where these openings have been previously filled with amorphous silicon, and where subsequent transistor channel regions will align to these openings. After patterning, the wafer is annealed in a high temperature cycle, where the regions of amorphous silicon in contact with the silicon substrate will grow into single crystal silicon suitable for transistor channel regions.

IN THE DRAWINGS

DETAILED DESCRIPTION OF THE INVENTION

The following is a description of a preferred process flow for making the SOI substrates of this invention, where the thicknesses shown are representative of the requirements for a low voltage logic circuit. Other thicknesses can used for different applications.

Figure 1:
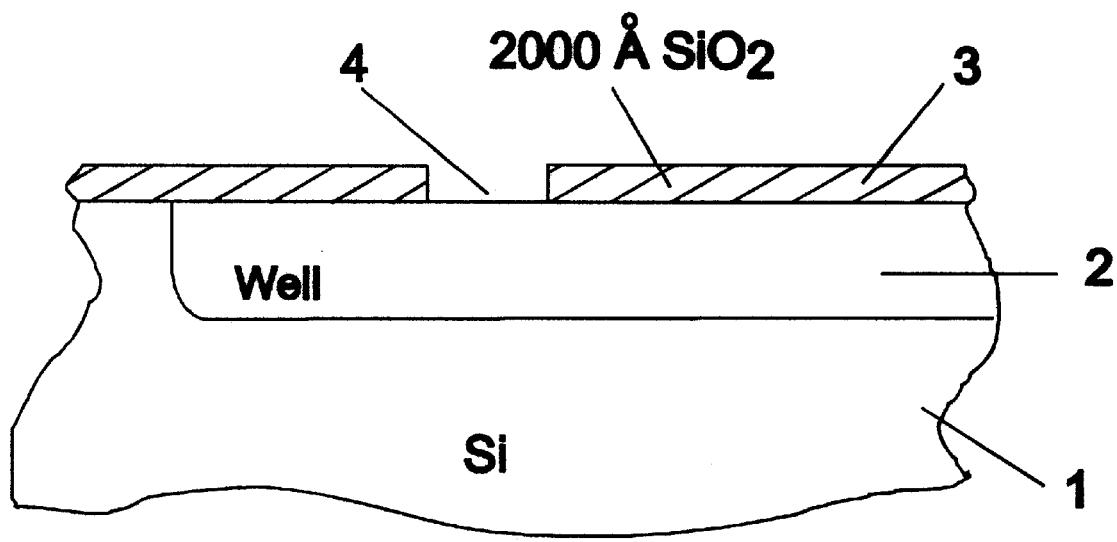
FIG. 1 is a cross section of one of many first etched openings in an oxide coated wafer.

1. FIG. 1 shows, at the start of the process, a portion of a silicon wafer 1 that has grown or deposited onto it silicon dioxide layer 3 with a thickness of 2000 Å, and shows the cross section of one of many openings 4 that have been formed by standard photo mask and etching techniques. These openings are typically very small with an area slightly larger than the channel area of the subsequent MOS transistors that will be positioned over them. The well 2 has previously been formed by conventional methods and is shown.

Figure 2:
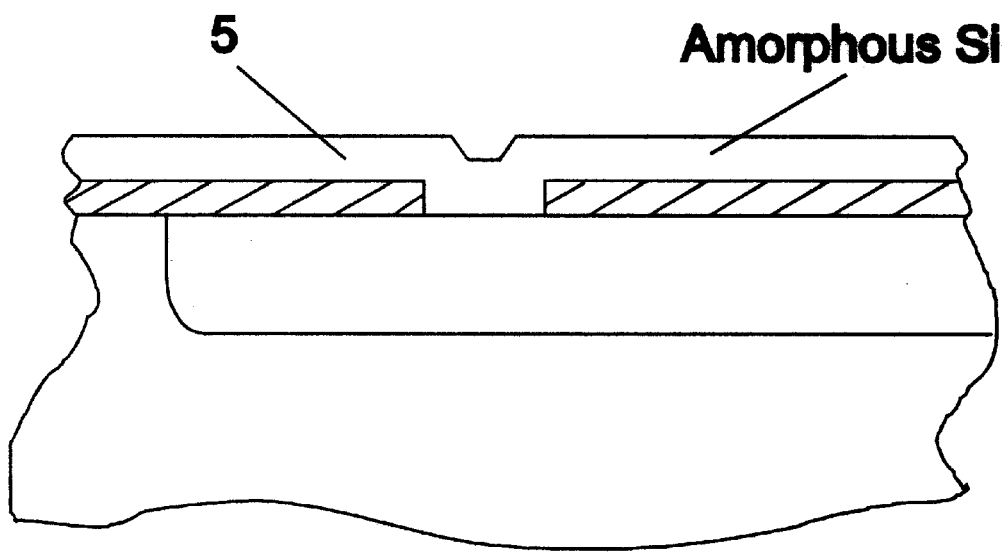
FIG. 2 shows a wafer with deposited amorphous silicon.

2. After a good cleaning, amorphous silicon 5 is deposited to a thickness greater than 2000 Å as shown in FIG. 2. In the same reactor hydrogen should be flowed over the wafers just prior to silicon deposition to assure that no residual oxide remains at the bottom of openings.

3. Chemical-mechanical polishing is performed so that the amorphous silicon is removed everywhere except in the openings 4; making the amorphous silicon top surface flush with the oxide top surface.

6. The wafer is annealed at a temperature that will convert the amorphous silicon into single crystal silicon, using the underlying substrate as a seed.

7. A thin layer of oxide 6 is grown on the silicon in openings 4, that will later protect the silicon to a thickness of about 100 Å.

Figure 3:
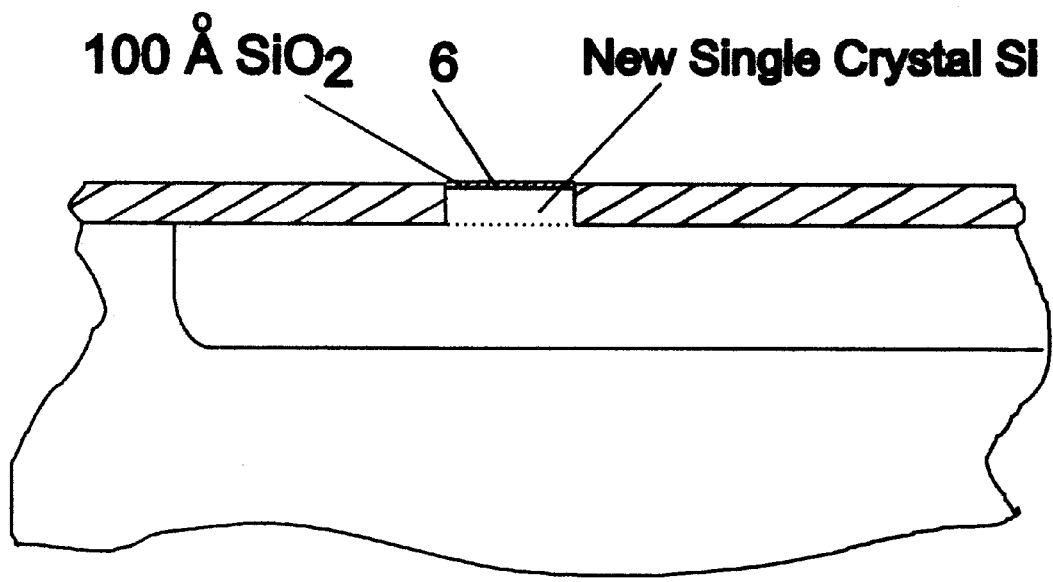
FIG. 3 shows a wafer after chem-mechanical polish of the amorphous silicon, and after amorphous silicon has been converted to single crystal silicon, and after thin oxide growth over the single crystal silicon.

8. A high temperature diffusion is performed sufficient to outdiffuse dopant from the well into the new single crystal silicon in openings 4; It will be desirable to have the doping level of the silicon in the openings 4 be approximately the same as the underlying well doping level. FIG. 3 shows the results to this point.

Figure 4:
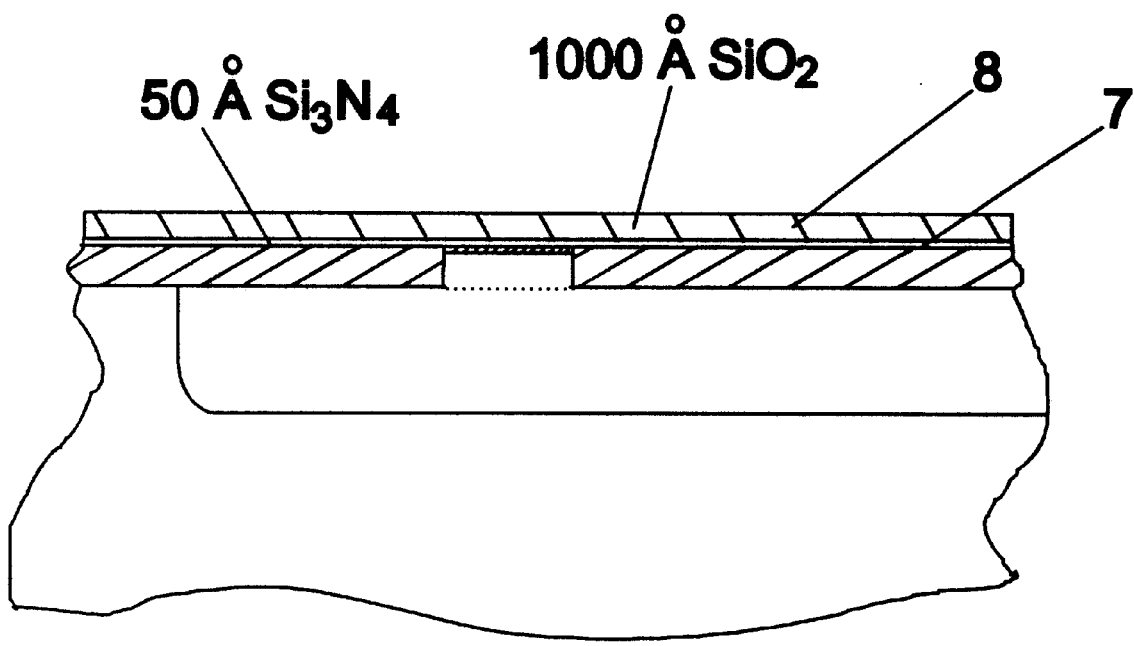
FIG. 4 shows a wafer after deposition of silicon nitride and silicon oxide.
Figure 5A:
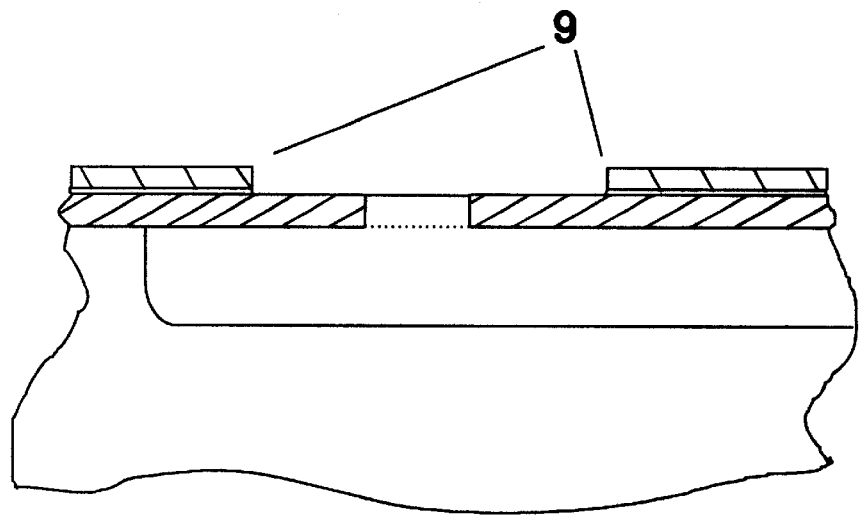
FIG. 5A shows a cross section after etching oxide and nitride and thin oxide.
Figure 5B:
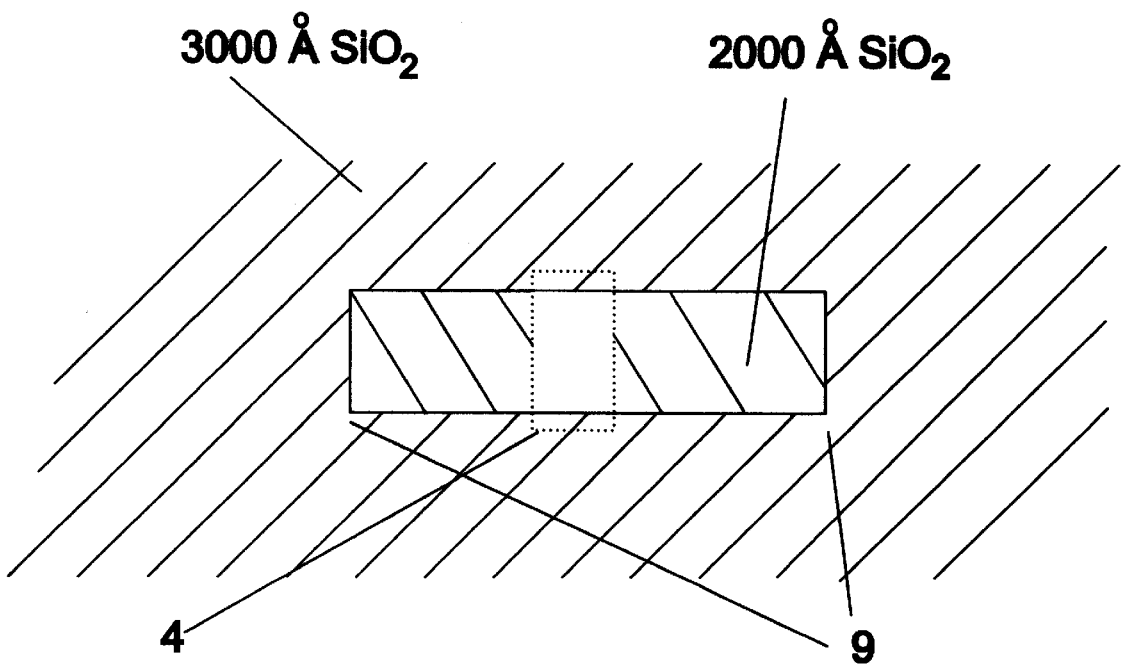
FIG. 5B shows a plan view after etching oxide and nitride thin oxide.
Figure 6:
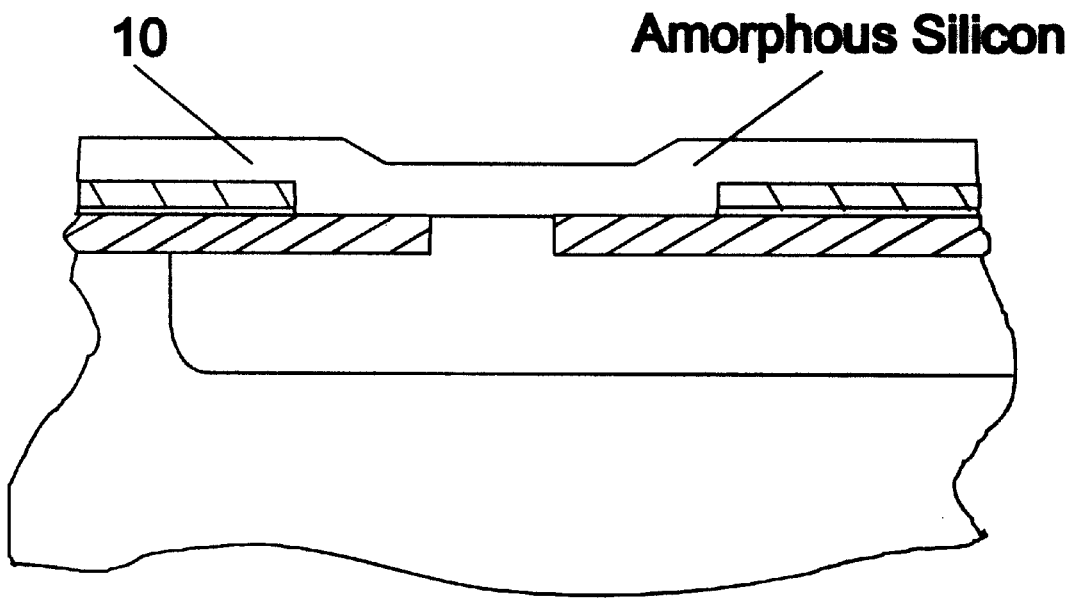
FIG. 6 shows a second deposition of amorphous silicon.
Figure 7:
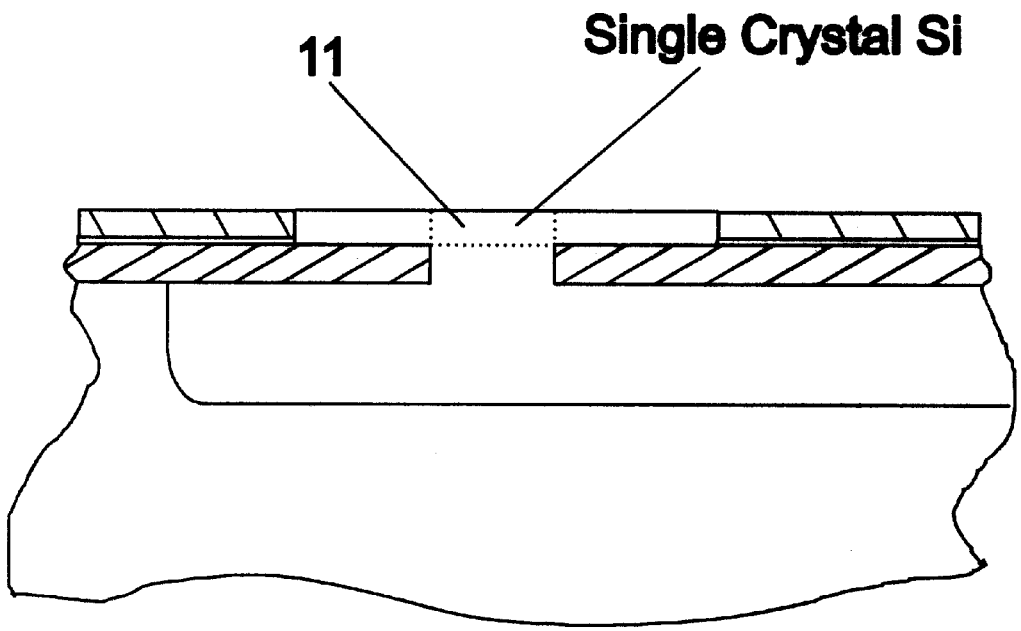
FIG. 7 shows a wafer after chem-mechanical polish of this second amorphous silicon, and the amorphous silicon has been converted to single crystal silicon.

9. Next a thin layer of silicon nitride 7 is deposited to a thickness of 50–100 Å. This will later act as an etch stop.
10. Next a layer of oxide 8 is deposited and densified. This oxide thickness should be the same as the desired thickness of the final transistor, which is shown in FIG. 4 as 1000 Å
11. The wafer is coated with resist which is exposed, developed and baked into a pattern that will define openings 9 that are positioned to lie beneath subsequent MOS transistor source, drain and channel regions.
12. Next openings 9 are etched into the oxide using the thin nitride layer as an etch stop, followed a short nitride etch, followed by a short oxide etch, and followed by resist removal. The result of these steps is shown in FIGS. 5A and 5B.
13. Next amorphous silicon 10 is deposited to a thickness of greater than 1000 Å, as shown in FIG. 6, with a brief prior etch using hydrogen gas.
14. The wafer is then chemical-mechanically polished to remove silicon everywhere except in the openings 9.
15. Finally the wafer is annealed at a temperature to form single crystal silicon in the regions 11 that lie over the first openings 4, being seeded by the single crystal silicon in openings 4. These single crystal regions 11 will later be the body regions of transistors, and can be doped by implantation if desired.

Figure 8:
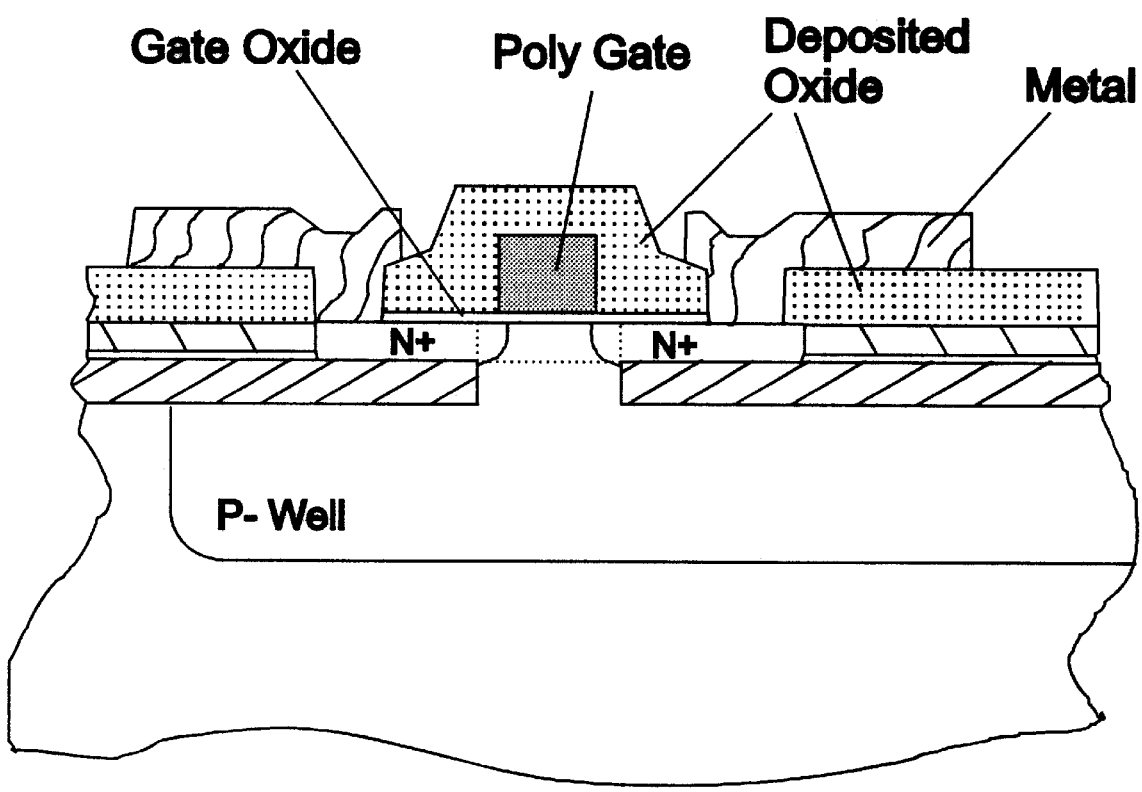
FIG. 8 shows a cross section of an NMOS transistor, that uses this invention's starting material.

Subsequent processing can proceed using well known procedures. FIG. 8 shows the cross section of a completed silicon gate NMOS transistor that uses this invention's starting material. More complex transistors are possible, such as transistors with silicided gates or source drain regions The openings 4 are somewhat wider and longer than the transistor channel region. This is to insure, that even with some small misalignment, the transistor regions directly under the Poly gates will be directly over the silicon substrate, thereby insuring these regions will be converted to single crystal silicon during the two high temperature amorphous silicon anneals.

All the Figures are not quite drawn to scale laterally; openings 4 to the silicon substrate, will typically be less than ⅙ of the transistor areas defined by openings 9, resulting in most of the transistor area positioned over oxide rather than over silicon. This will reduce the capacitance of the source and drain junctions and will allow source and drain contact openings to aluminum to be made with zero misalignment tolerance.

The process flow as described results in field regions between transistors having a thickness of 3000 Å. For a modern submicron logic circuit process, with a supply voltage of about 3 volts, and well surface dopings of about $10^{18}$ ions/cm$^3$, this should result in very high field inversion voltages, and will prevent bulk punch through either from source to drain or between neighboring devices. Such a high well doping is not possible with older non SOI processes because source and drain junction capacitance would be prohibitive. Also, such high well doping does not affect the body regions 11 because they can be independently doped.

I claim:

1. A silicon-on-insulator (SOI) substrate process where a first insulating layer is grown or deposited onto a silicon wafer;

where one or more first openings are etched to the silicon wafer through this first layer, with the openings positioned to align to subsequent MOS transistor channel regions;

where a first layer of amorphous silicon is deposited thicker than the first insulating layer thickness;

where this first amorphous silicon layer is chemically-mechanically polished leaving only amorphous silicon in the first openings, with the top surface of the amorphous silicon becoming flush with the top surface of the first insulating layer;

where the wafer is annealed to a high enough temperature to convert the first amorphous silicon into single crystal silicon;

where next a thin layer of an etch stop material is deposited and a second insulating layer is deposited;

where the second insulating layer is etched with a second pattern of openings, stopping at the etch stop, and continuing to etch the etch stop, stopping at the underlying first insulating layer or at the underlying silicon in the first openings;

where these second openings are the shape of, and laterally positioned to where a subsequent MOS transistor's source, drain and channel areas will be positioned;

where the first openings will be laterally positioned within the second openings, and beneath the channel regions of subsequent MOS transistors;

where a second layer of amorphous silicon is deposited to a thickness greater than the thickness of the second insulating layer;

where the second amorphous silicon layer is chemically-mechanically polished leaving only silicon in the first openings, whose top surface is flush with the top surface of the second insulating layer;

where the wafer is annealed to a high enough temperature to convert to single crystal those regions of the second amorphous layer that are directly over the single crystal silicon in the first openings.

2. The process of claim 1, where the insulating layers are silicon dioxide.

3. The process of claim 1, where the first insulating layer is approximately 2000 Å thick, and the second insulating layer is approximately 1000 Å thick.

4. The process of claim 1, where the etch stop layer is silicon nitride.

5. The process of claim 4, where the silicon nitride is approximately 100 Å thick.

6. The process of claim 5, where the single crystal silicon in the first openings has a thin film of oxide grown just prior to the etch stop deposition.

* * * * *